United States Patent
Robbe et al.

(10) Patent No.: US 7,808,415 B1
(45) Date of Patent: Oct. 5, 2010

(54) SIGMA-DELTA MODULATOR INCLUDING TRUNCATION AND APPLICATIONS THEREOF

(75) Inventors: Michel Robbe, Conflans Sainte Honorine (FR); Stephan Doucet, Villebon S/Yvette (FR)

(73) Assignee: Acco Semiconductor, Inc., Sunnyvale, CA (US)

( * ) Notice: Subject to any disclaimer, the term of this patent is extended or adjusted under 35 U.S.C. 154(b) by 45 days.

(21) Appl. No.: 12/410,964

(22) Filed: Mar. 25, 2009

Related U.S. Application Data

(60) Provisional application No. 61/163,182, filed on Mar. 25, 2009.

(51) Int. Cl.
*H03M 3/00* (2006.01)

(52) U.S. Cl. ...................... 341/143; 341/155

(58) Field of Classification Search ................ 341/155, 341/143, 144
See application file for complete search history.

(56) References Cited

U.S. PATENT DOCUMENTS

| | | | |
|---|---|---|---|
| 4,523,111 A | 6/1985 | Baliga | |
| 4,811,075 A | 3/1989 | Eklund | |
| 5,061,903 A | 10/1991 | Vasile | |
| 5,126,807 A | 6/1992 | Baba et al. | |
| 5,559,049 A | 9/1996 | Cho | |
| 5,677,927 A | 10/1997 | Fullerton et al. | |
| 5,898,198 A | 4/1999 | Herbert et al. | |
| 5,912,490 A | 6/1999 | Hebert et al. | |
| 6,061,008 A * | 5/2000 | Abbey | 341/143 |
| 6,088,484 A * | 7/2000 | Mead | 382/232 |
| 6,275,177 B1 | 8/2001 | Ho et al. | |
| 6,570,518 B2 * | 5/2003 | Riley et al. | 341/143 |
| 6,633,195 B2 | 10/2003 | Baudelot et al. | |
| 6,703,684 B2 | 3/2004 | Udrea et al. | |
| 7,049,669 B2 | 5/2006 | Ma et al. | |
| 7,162,042 B2 * | 1/2007 | Spencer et al. | 381/77 |
| 7,312,481 B2 | 12/2007 | Chen et al. | |
| 2002/0093442 A1 | 7/2002 | Gupta | |
| 2005/0287966 A1 | 12/2005 | Yoshimi et al. | |
| 2007/0018865 A1 | 1/2007 | Chang et al. | |
| 2008/0291069 A1 | 11/2008 | Inukai et al. | |
| 2009/0066549 A1 | 3/2009 | Thomsen et al. | |

FOREIGN PATENT DOCUMENTS

| | | |
|---|---|---|
| EP | 2006009009 | 1/1996 |
| WO | 9956311 | 11/1999 |
| WO | 0139451 | 5/2001 |

(Continued)

OTHER PUBLICATIONS

Vaes, H. M. J. et al., "High Voltage, High Current Lateral Devices," IEDM Technical Digest, 1988, pp. 87-90.

(Continued)

*Primary Examiner*—Peguy JeanPierre
(74) *Attorney, Agent, or Firm*—Peters Verny, LLP

(57) ABSTRACT

A multi-stage sigma-delta modulator including bit truncation between stages. The bit truncation reduces the number of bits that must be processed in subsequent stages and thus allows for faster response times. In some embodiments the gain of a feedback loop is selected to compensate for the bit truncation such that the sigma-delta modulator operates in a stable state.

26 Claims, 5 Drawing Sheets

FOREIGN PATENT DOCUMENTS

| | | |
|---|---|---|
| WO | 2006054148 | 5/2006 |
| WO | 2007042850 | 4/2007 |

OTHER PUBLICATIONS

Pocha, Michael D. et al. "Threshold Voltage Controllability in Doulbe-Diffused MOS Transistors," IEEE Transactions on Electronic Devices, vol. ED-21, No. 12, Dec. 1994.

Gautier, D., et al., "Improved Delta Sigma Modulators for High Speed Applications," Acco Semiconductors, Mar. 25, 2009.

Azakkour, A. et al., "Challenges for a new integrated Ultra-wideband (UWB) source," IEEE, 2003 pp. 433-437.

Azakkour, A. et al., "A new integrated moncycle generator and transmitter for Ultra-wideband (UWB) communications," IEEE Radio Frequency Circuits Symposium, 2005 pp. 79-82.

Choia, Y. H. et al., "Gated UWB Pulse Signal Generation," IEEE, 2004 pp. 122-124.

PCT/US2008/001938 Int'l Search Report, Jun. 26, 2008.
PCT/IB05/003426 Int'l Search Report, Mar. 20, 2006.
PCT/IB05/003426 Written Opinion, May 16, 2007.
PCT/IB05/003029 Int'l Search Report, Jul. 6, 2006.
PCT/IB05/003029 Written Opinion, Mar. 12, 2008.
PCT/US10/27921 Int'l Search Report and Written Opinion, May 10, 2010.

* cited by examiner

SIGMA-DELTA MODULATOR INCLUDING TRUNCATION AND APPLICATIONS THEREOF

CROSS-REFERENCE TO RELATED APPLICATIONS

This application claims priority to and benefit of U.S. Provisional Patent Application No. 61/163,182 entitled "Improved Delta Sigma Modulators for High Speed Applications" and filed Mar. 25, 2009. This provisional patent application is hereby included herein by reference.

BACKGROUND

1. Field of the Invention

The invention is in the field of electronics.

2. Related Art

Sigma-delta modulators are commonly used to generate pulses whose summed area is representative of an input signal. The generated pulses may vary in their width or their separation. Sigma-delta modulators are found in a wide variety of electronic components including analog-to-digital (ADC) converters, digital-to-analog (DAC) converters, frequency synthesizers, switched-mode power supplies, switched amplifiers and motor controls.

FIG. 1 illustrates an example of a second order sigma-delta modulator 100. This module includes a Combiner 105 configured to combine an input signal A and a feedback signal F. The combined signals A and F are integrated by a first Integrator 110 to produce an output B. A Combiner 115 is used to combine the output B and the feedback signal F. The combined signals B and F are then integrated using a second Integrator 120 to produce an output C, which is quantized using a Quantizer 125 to produce a final output D. The output is provided to a Feedback Generator 130 to generate the feedback signal F. The feedback signal is configured to reduce noise introduced by the integration and quantization.

Sigma-delta modulators of first order, third order or higher order are known in the prior art. In a first order sigma-delta modulator the Combiner 115 and Integrator 120 would be omitted, while in a third order modulator an additional Combiner 115 and Integrator 120 would be included. An advantage of higher order is that each stage of Combiner 115 and Integrator 120 servers to further reduce noise in the frequency band of interest. A disadvantage of higher orders is that then number of bits required to represent the integrated signals (e.g., signals B and C) is greater at each stage. This increases the complexity and time required to perform the signal combinations at each subsequent combiner, e.g., Combiner 115.

SUMMARY

Various embodiments of the invention include systems and methods of reducing the number of bits used to represent signals between stages of a sigma delta modulator. These embodiments include truncation of the output of one or more integrators. Typically, this truncation includes the removal of one or more least significant bits (LSB). Optionally, truncation is performed through a feedback process in which the one or more LSB is used to generate a feedback signal that is recombined with the signal to be truncated.

The sigma delta modulator of the invention may be used in a switched power amplifier, a digital to analog converter, or the like. Some embodiments of the invention are used in place of prior art sigma-delta modulators in applications requiring high frequency digital inputs.

Various embodiments of the invention include a sigma-delta modulator circuit comprising a first modulation stage including at least a first combiner and a first integrator, the first combiner configured to combine an input signal and a first feedback signal, the first integrator configured to integrate an output of the first combiner and to produce a first multi-bit output; a first truncation stage configured to receive the first multi-bit output and to truncate a least significant bit from the first multi-bit output; a second modulation stage including at least a second combiner and a second integrator, the second combiner configured to combine the truncated output of the first modulation stage and a second feedback signal, the second integrator being configured to integrate an output of the second combiner to produce a second multi-bit output; and a feedback generator configured to generate the first feedback signal and the second feedback signal.

Various embodiments of the invention include a power amplifier comprising a first sigma-delta modulator stage configured to receive an input signal and to produce a multi-bit output; a second sigma-delta modulator stage configured to receive an input signal generated using the first sigma-delta modulator stage; a first truncation stage disposed between the first sigma-delta modulator stage and the second sigma-delta modulator stage, configured to receive the multi-bit output and configured to truncate at least one of the least significant bits of the multi-bit output prior to providing the truncated multi-bit output to the second sigma-delta modulator; and a feedback generator configured to provide a gain to a feedback loop between an output of a quantizer and the first sigma-delta modulator stage.

Various embodiments of the invention include a method comprising receiving a signal; combining the received signal with a first feedback signal to produce a first combined signal; integrating the first combined signal to produce a first multi-bit output; truncating the first multi-bit output; combining the truncated first multi-bit output with a second feedback signal to produce a second combined signal; integrating the second combined signal to produce a second multi-bit output; quantizing the second multi-bit output or an output generated using the second multi-bit output to produce a quantized signal; and using the quantized signal to produce the first feedback signal and the second feedback signal.

DETAILED DESCRIPTION

In sigma delta modulator a received input signal is combined with a feedback signal using a combiner. The output of the combiner is received by an integrator configured to output a multi-bit value representative of an integration of the output of the combiner. In various embodiments, this multi-bit value includes 2, 3, 4 or more bits. One of the bits may be designated as a sign bit. The multi-bit output may be in a 2s-compliment format. The output of the integrator includes more bits than the input.

Each stage of a multi-stage sigma-delta modulator includes a combiner and an integrator. Thus, each stage has a multi-bit output. In prior art sigma-delta modulators the output of each stage includes a greater number of bits than the signal received by that stage. As a result, each subsequent stage must be configured to manipulate a greater number of bits. In contrast, in various embodiments of the invention one or more of the stages of a multi-stage sigma-delta modulator further comprises a truncator configured to reduce the number of bits received from an integrator prior to providing the bits to a next stage of the multi-stage sigma-delta modulator. Typically, the truncator removes the least significant bit or bits (LSB) of the integrator output. The number of bits received by the next stage is, thus, less than that generated by the integrator of the previous stage.

Figure 1:
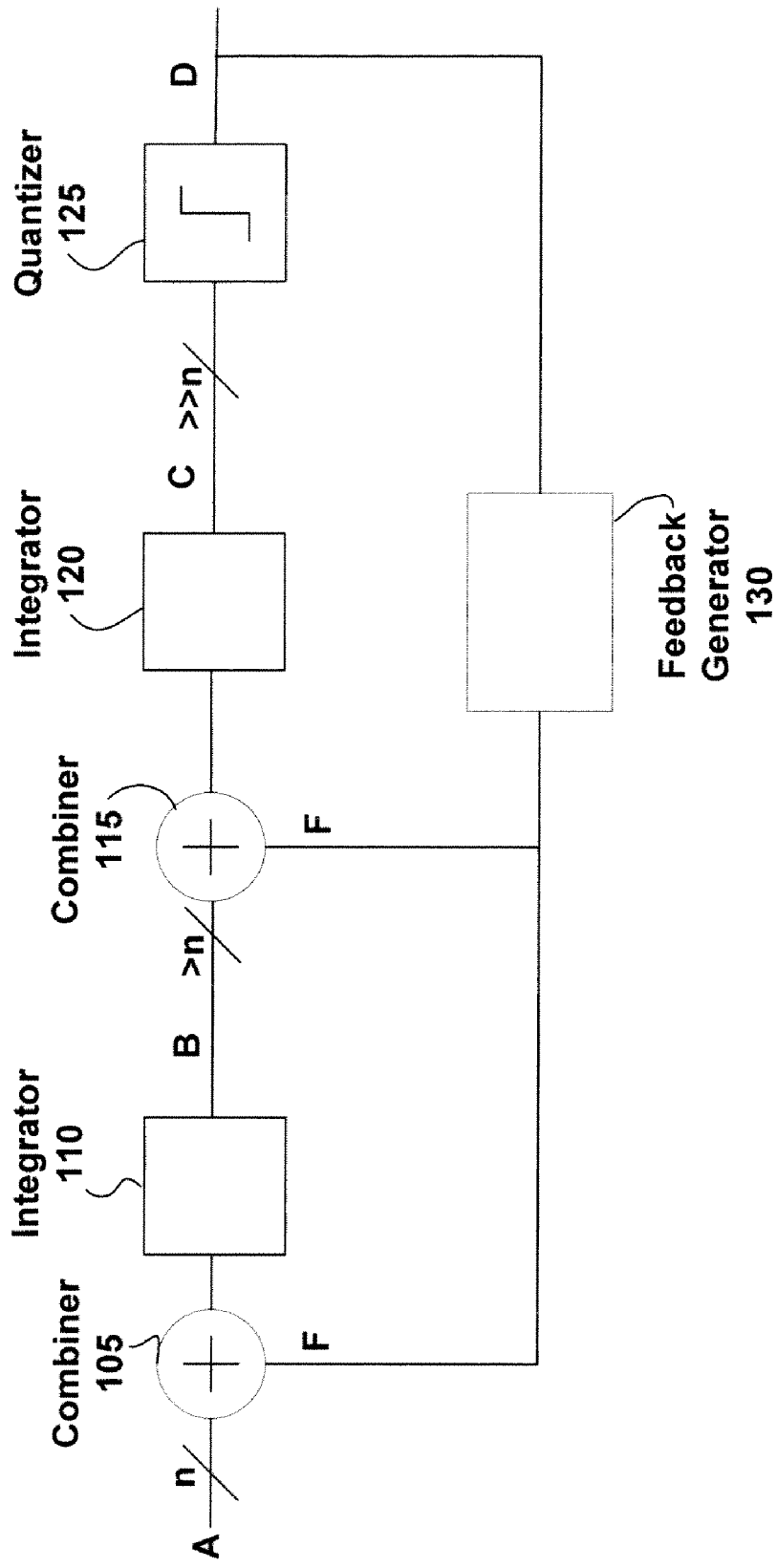
FIG. 1 illustrates a two stage sigma delta modulator of the prior art.
Figure 2:
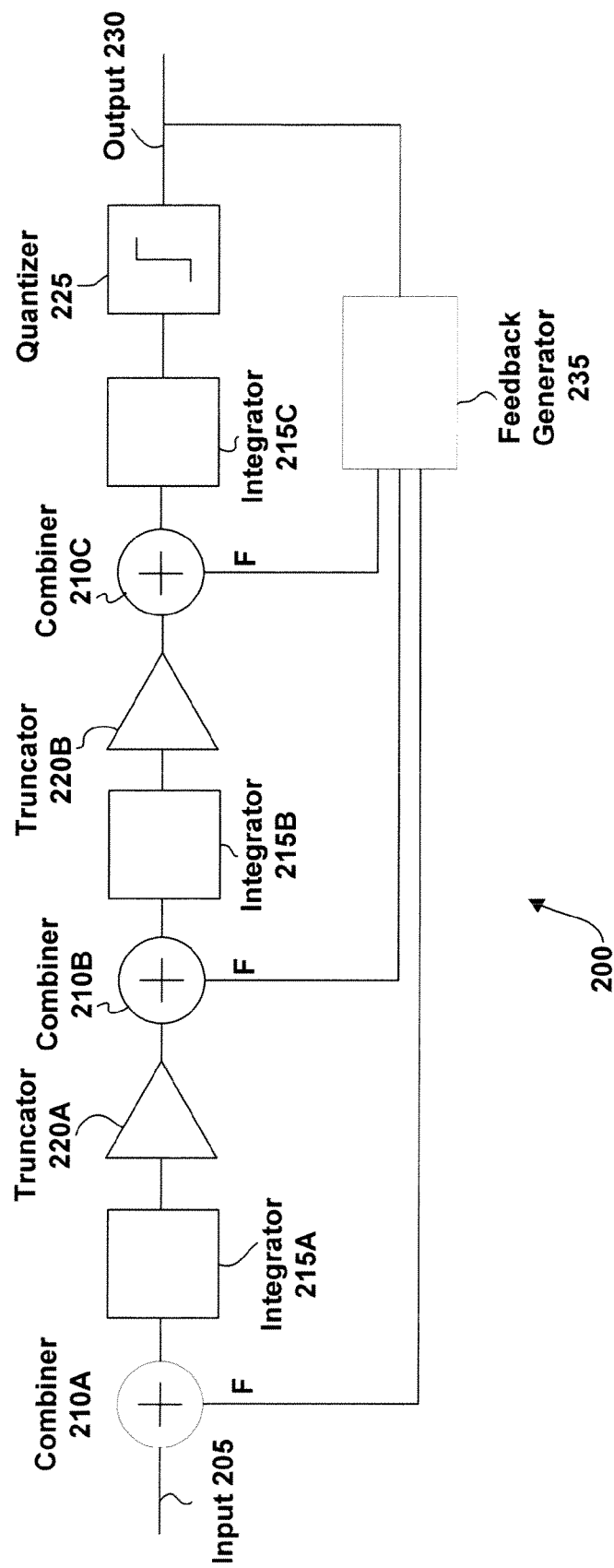
FIG. 2 illustrates a multi-stage sigma-delta modulator, according to various embodiments of the invention.

FIG. 2 illustrates a multi-stage Sigma-Delta Modulator 200, according to various embodiments of the invention. Sigma-Delta Modulator 200 includes truncators between three sigma-delta stages. However, alternative embodiments of the invention include two, four or more sigma-delta stages. Truncators may be included between some or all of these sigma-delta stages. Each of the truncators is configured to remove one or more bits from the output of the preceding sigma-delta stage.

More specifically, Sigma-Delta Modulator 200 comprises an Input 205 configured to receive a signal, a plurality of Combiners 210 (individually labeled 210A-210C), a plurality of Integrators 215 (individually labeled 215A-215C), and a plurality of Truncators 220 (individually labeled 210A-210B). Sigma-Delta Modulator 200 further comprises a Quantizer 225 configured to generate a signal at an Output 230. The signal at Output 230 is used by a Feedback Generator 235 to generate one or more feedback signals (F) which are provided to Combiners 210.

In some embodiments, Combiners 210A-210C include an adder configured to add two or more signals. In applications wherein a high frequency signal is received Combiners 210A-210C are typically configured to operate at a frequency higher (e.g., 2× or 4×) than the frequency of the received signal such that the signal is oversampled. In various embodiments, Combiner 210A is configured to process input signals of at least 100 MHz, 500 MHz, 1 GHz, 2 GHz, 4 GHz or 10 GHz, or less than 100 MHz.

Different members of Combiners 210A-210C are optionally configured to receive different numbers of bits. For example, in various embodiments, Combiner 210A may be configured to receive 1 bit while Combiners 210B and 210C may each be configured to receive 1, 2, 4 or more bits. As is discussed elsewhere herein, the numbers of bits received by Combiners 210A and 210C are dependant on the configuration of Truncators 220A and 220B. Combiner 210B is optionally configured to receive the same number of bits as Combiner 210A. Likewise, Combiner 210C is optionally configured to receive the same number of bits as Combiner 210B.

In some embodiments, one or more of Combiners 210A-210C include adders configure for maximum sampling frequency. For example, the sampling frequency of an adder having two inputs is typically greater than an adder having more than two inputs, other factors remaining constant. In addition, an adder having more than two inputs can be replaced by adders in series each having just two inputs. For example, the transform illustrated in Table 1 below can be achieved if one of the adders is a special "adder" configured to output the inverse of the sign bit.

TABLE 1

$X_0 \rightarrow Y_0$
$X_1 \rightarrow Y_1$
$X_2 \rightarrow Y_2$
$X_3 \rightarrow Y_3$
Sign bit -> (inversion) -> $Y_4$
Feedback bit -> New Sign bit The special adder is used on that part of the output of the Truncators 220, discussed further elsewhere herein, that includes the most significant bits (other than a carry bit). The carry bit of the Truncators 220 is then combined with the output of the special adder using another two input adder. An example, of this configuration is provided elsewhere herein, for example in relation to FIG. 6.

Integrators 215A-215C are configured to receive the outputs of Combiners 210A-210C, respectively, to integrate these outputs over time, and to generate a multi-bit outputs of their own representative of the results of the integration. The complexity of each of integrators 215A-215C is dependent, in part, on the number of bits they receive at their inputs. A greater number of bits requires more complexity but also provides a greater accuracy. Integrators 215A-215C may include any of the integrator circuits used in sigma-delta modulators of the prior art. The sign of the output of the Integrators 215A-215C is optionally stored in the most significant bit. In some embodiments, Integrator 215A is configured to receive at least six bits of input.

Truncators 220A and 220B are configured to truncate the outputs of Integrators 215A and 215B. More specifically, they are configured to remove one or more least significant bits from the output of Integrators 215A and 215B. In various embodiments, number of bits removed is 1, 2, 3, 4 or more. The number of bits removed by Truncator 220A is optionally different than the number of bits removed by Truncator 220B. As is described further elsewhere herein, Truncators 220A and 220B optionally include a feedback loop in which the removed bits are used to reduce noise at the inputs of the truncators.

Quantizer 225 is configured to quantize the output of Integrator 215C. Quantizer 225 may be configured to process decimal or 2s-complement inputs. Quantizer 225 may include any of the quantizers used in sigma-delta modulators of the prior art. Quantizer 225 may be configured to output one bit or more than one bit.

Feedback Generator 235 is configured to use the output of Quantizer 225 to generate one or more feedback signals (F) and to provide these feedback signals to Combiners 210A-210C. The feedback signals provided to Combiners 210A-210C may be different or the same. Feedback Generator 235 is optionally configured to provide a non-unitary gain, i.e., a gain not equal to one. For example, in some embodiments Feedback Generator 235 is configured to provide a gain of approximately 1.6× or 4 dB in the feedback to Combiner 210A. This gain compensates for the removal of the least significant bits by Truncators 220A and 220B and thus results in a stable system. In alternative embodiments, this gain may be between one and two. The feedback loop gain at each stage is typically the same.

Figure 3:
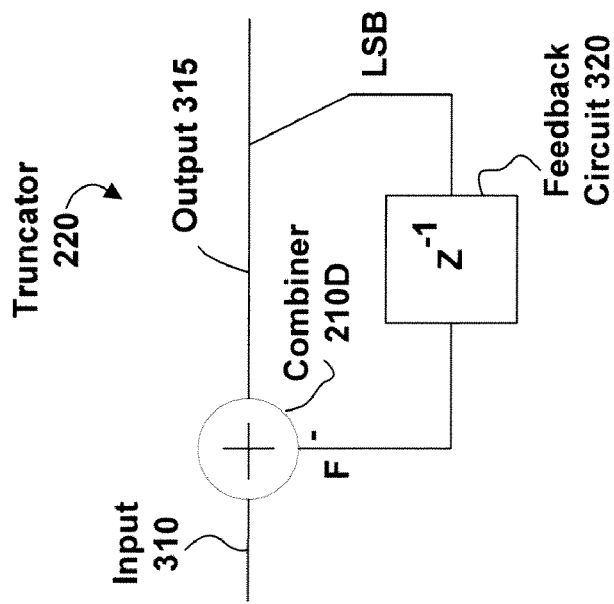
FIG. 3 illustrates a truncation circuit, according to various embodiments of the invention.

FIG. 3 illustrates embodiments of Truncators 220. Truncators 220 receive a signal from one of Integrators 215 at an Input 310. The signal is received at a Combiner 210D. Combiner 210D is similar in operation to Combiners 210A-210C. At an Output 315 of Combiner 210 a signal including m+n bits is produced. Of these bits the n least significant bits (LSB) are directed into a feedback loop including a Feedback Circuit 320. In various embodiments, the number of bits n is 1, 2, 3, 4 or more. The remaining m bits are provided as an output of Truncator 220. Feedback Circuit 320 is configured to change the sign of the value represented by the n bits. This change in sign is equivalent to multiplying the value represented by the n bits by −1. By combining the received signal with an inversion of the least significant bits in Combiner 210, these bits are removed from the received signal.

Figure 4:
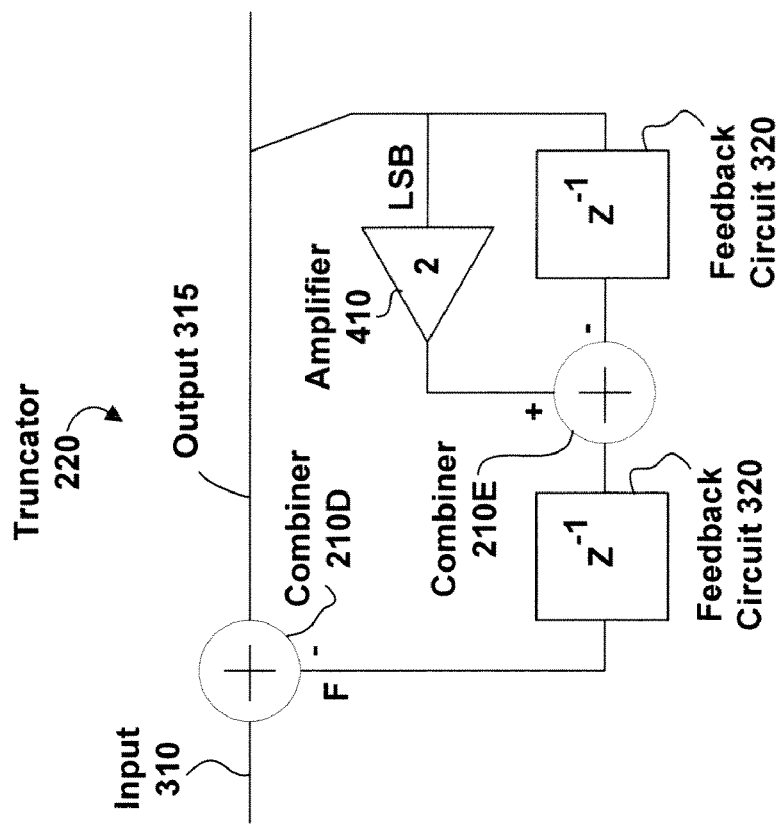
FIG. 4 illustrates a second order truncation circuit, according to various embodiments of the invention.

FIG. 4 illustrates alternative embodiments of Truncators 220. These embodiments include a second order truncation in which a first of the least significant bits is multiplied by −1 using a first Feedback Circuit 320 and combined with two or more of the least significant bits in a first Combiner 210E. Combiner 210E is also configured to receive a copy of the least significant bits that has been passed through an Amplifier 410. In some embodiments, Amplifier 410 has a gain of approximately 2. Combiner 210 is configured to operate in a manner similar to the other Combiners 210 discussed herein. The output of Combiner 210E is then multiplied by −1 using a second Feedback Circuit 320. The output of the second Feedback Circuit 320 is provided as the feedback signal to Combiner 210D.

Figure 5:
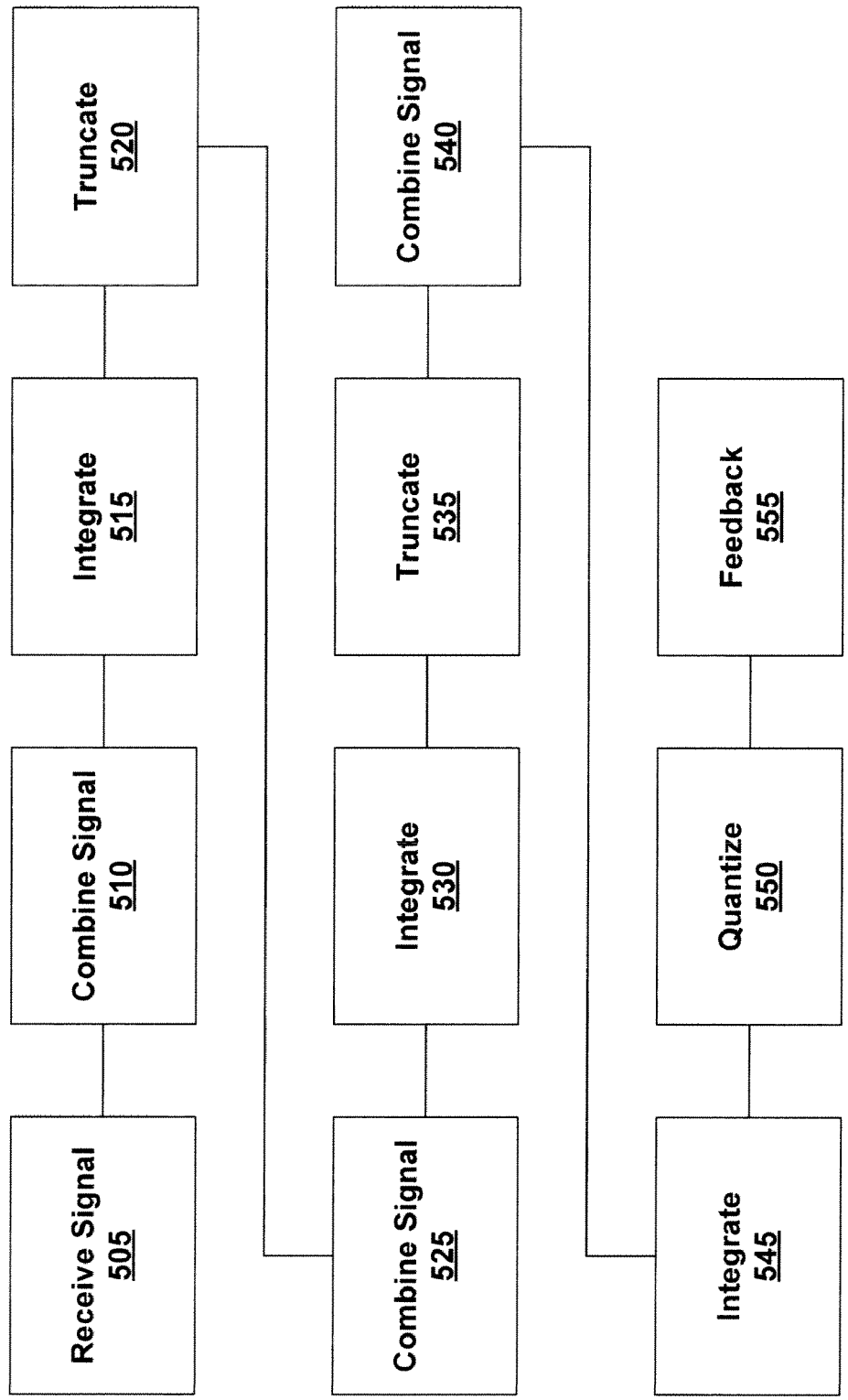
FIG. 5 illustrates methods, according to various embodiments of the invention.

FIG. 5 illustrates a method, according to various embodiments of the invention. In a Receive Signal Step 505, a signal is received at Input 205. This signal can be digital. Combine Signal Step 510, Combiner 210A is used to combine the signal received in Receive Signal Step 505 with a feedback generated using Feedback Generator 235. As discussed elsewhere herein, this combination is typically performed at a frequency that results in oversampling of the received signal. For example, in some embodiments Combiner 210A is configured to sample the received signal at four times the Nyquist frequency.

In an Integrate Step 515, Integrator 215A is used to integrate the output of Combiner 210A and produce a multi-bit output. The output of Integrator 215A typically includes a greater number of bits than the input of Integrator 215A. The integration performed by Integrator 215A (and 215B and 215C) is recursive in that the signal received at the input is dependent on the integrated output through the feedback loop.

In a Truncate Step 520, one or more least significant bits are removed from the multi-bit output of Integrator 215A using Truncator 220A. This process optionally includes using the one or more least significant bits in a feedback loop to a combiner within Truncator 220A. This feedback loop reduces noise associated with the truncation process.

In a Combine Signal Step 525, the output of Truncator 220A is combined with a feedback signal using Combiner 210. Combine Signal Step 525 is performed in a manner similar to Combine Signal Step 210.

In an Integrate Step 530, the output of Combiner 210B is integrated using Integrator 215B to produce a multi-bit output. Integrate Step 530 is performed in a manner similar to Integrate Step 515. The output of Integrator 215B may include fewer, the same, or more bits than the output of Integrator 215A.

In a Truncate Step 535, one or more least significant bits are removed from the multi-bit output of Integrator 215B using Truncator 220B. This process optionally includes using the one or more least significant bits in a feedback loop to a combiner within Truncator 220B. In some embodiments, a greater number of bits are removed in Truncate Step 535 relative to Truncate Step 520. For example, two bits may be removed in Truncate Step 520 while four bits are removed in Truncate Step 535.

In a Combine Signal Step 540, the output of Truncator 220B is combined with a feedback signal using Combiner 210C. Combine Signal Step 540 is performed in a manner similar to that of Combine Step 525.

In an Integrate Step 545, the output of Combiner 210C is integrated using Integrator 215C. Integrate Step 545 is performed in a manner similar to Integrate Step 530. Steps 535, 540 and 545 are optional in systems comprising fewer sigma-delta stages than are illustrated in FIG. 2. E.g., embodiments not including Combiner 210B, Integrator 215B and Truncator 220B. In these embodiments the output of Truncator 220A is received by Combiner 210. Likewise, addition occurrences of Step 535, 540 and 545 may be performed in systems including additional sigma-delta stages.

In a Quantize Step 550, the output of Integrator 215C is quantized using Quantizer 225. The output of Quantizer is optionally one bit. In a Feedback Step 555, the output of Quantizer 225 is used to generate the feedback signal(s) using Feedback Generator 235. These feedback signals are provided to Combiner 210A, Combiner 210B and Combiner 210C. In some embodiments, Feedback Step 555 includes providing a gain to the feedback signal. Examples of gain values that may be provided are discussed elsewhere herein. The feedback produced in Feedback Step 555 is configured to reduce noise introduced by the integration and/or combination steps.

Figure 6:
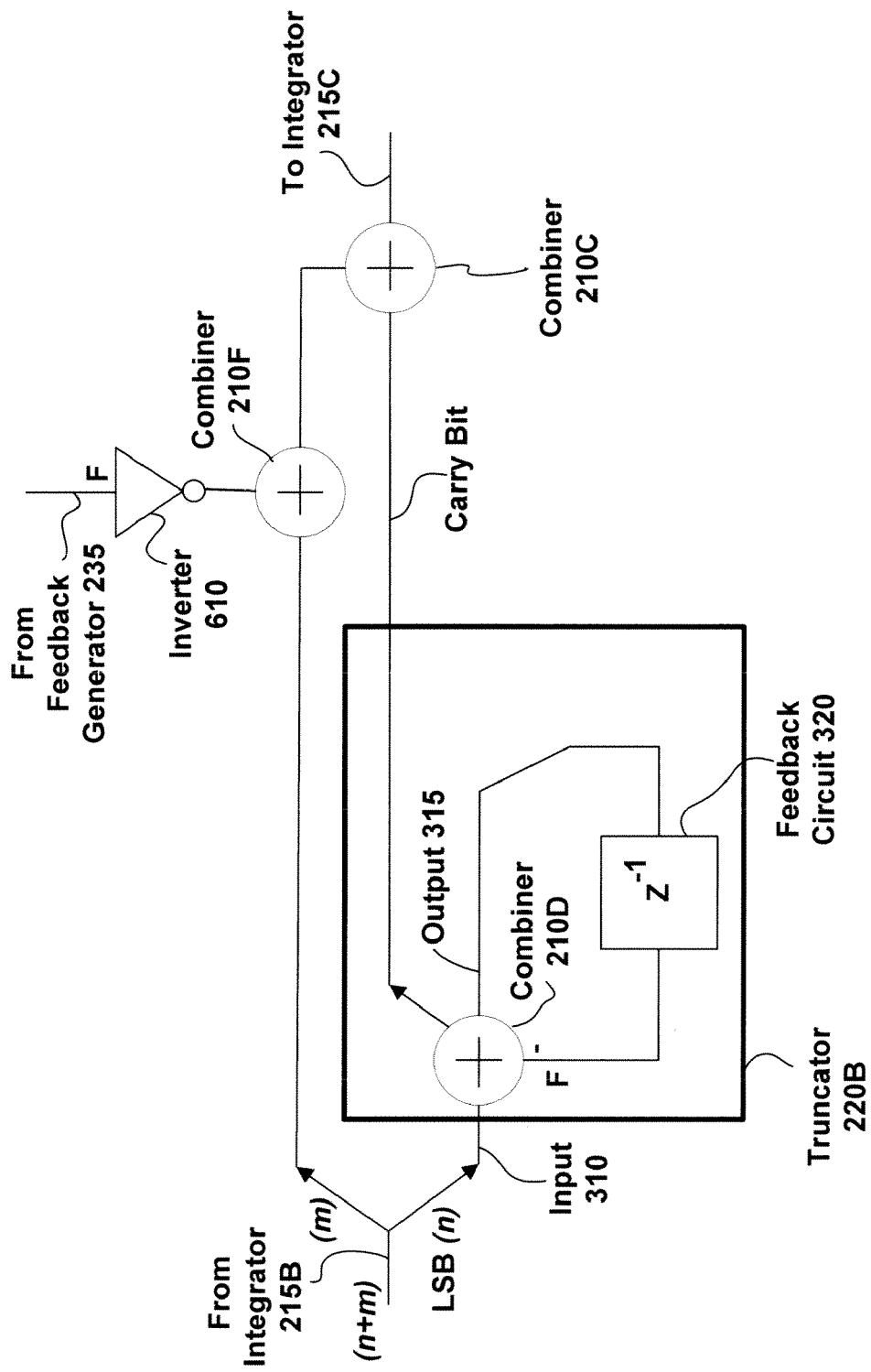
FIG. 6 illustrates a circuit including combiners having two inputs, according to various embodiments of the invention.

FIG. 6 illustrates a circuit including Combiners 210D, 210B and 210F each having only two adder (signal) inputs, according to various embodiments of the invention. In some embodiments, this circuit is a subset of the circuit illustrated in FIG. 2. The Combiner 210F in combination with an Inverter 610 includes a special adder configured for achieving the transfer function illustrated in Table 1. In this circuit, an input including nm bits is received from Integrator 215B. This input is separated into n and m bits. The least significant bits (n) are directed to a two input embodiment of Combiner 210D in Truncator 220B. The carry bit of this combiner servers as the output of Truncator 220B. The m most significant bits are provided to the two input special adder. The output of the special adder and the carry bit are combined in Combiner 210C. Similar circuits may be used elsewhere in embodiments of the invention. Typically, the value of n is one.

Several embodiments are specifically illustrated and/or described herein. However, it will be appreciated that modifications and variations are covered by the above teachings and within the scope of the appended claims without departing from the spirit and intended scope thereof. For example, the disclosed sigma-delta modulator may be included in a power amplifier. In some embodiment the signal provided at Output 230 is provided to an antenna and Quantizer 225 is configured to match the impedance of this antenna.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

What is claimed is:

1. A sigma-delta modulator circuit comprising:
   a first modulation stage including at least a first combiner and a first integrator, the first combiner configured to combine an input signal and a first feedback signal, the first integrator configured to integrate an output of the first combiner and to produce a first multi-bit output;
   a first truncation stage configured to receive the first multi-bit output and to truncate a least significant bit from the first multi-bit output;
   a second modulation stage including at least a second combiner and a second integrator, the second combiner configured to combine the truncated output of the first modulation stage and a second feedback signal, the second integrator being configured to integrate an output of the second combiner to produce a second multi-bit output; and
   a feedback generator configured to generate the first feedback signal and the second feedback signal.

2. The sigma-delta modulator circuit of claim 1, wherein the first combiner is configured to sample the input signal, wherein the input signal is at a frequency of at least 4 GHz.

3. The sigma-delta modulator circuit of claim 1, wherein the first truncation stage is configured to truncate two bits from the first multi-bit output.

4. The sigma-delta modulator circuit of claim 1, wherein the first truncation stage is a second order truncation stage.

5. The sigma-delta modulator circuit of claim 1, wherein the first truncation stage include a feedback loop configured generate a feedback using the leas significant bit.

6. The sigma-delta modulator circuit of claim 1, wherein the first feedback signal is different from the second feedback signal.

7. The sigma-delta modulator circuit of claim 1, wherein the first feedback signal is alternatively combined with different bits of the input signal.

8. The sigma-delta modulator circuit of claim 1, further comprising a quantizer configured to quantize a signal generated using the second modulation stage.

9. The sigma-delta modulator circuit of claim 7, wherein the feedback generator is configured to generate the feedback signal using an output of the quantizer.

10. The sigma-delta modulator circuit of claim 1, wherein the feedback generator is configured to result in a gain of approximately 1.6 in a feedback loop including the first modulation stage the quantizer and the feedback generator.

11. The sigma-delta modulator circuit of claim 1, wherein the feedback generator is configured to produce a gain between one and two in a feedback loop including the first modulation stage.

12. The sigma-delta modulator circuit of claim 1, wherein the first combiner and the first truncation stage include adders having only 2 signal inputs each.

13. The sigma-delta modulator circuit of claim 1, further comprising:
   a third modulation stage disposed between the second modulation stage and the quantizer and including at least a third combiner and a third integrator, the third combiner configured to combine a signal received from the second modulation state and a third feedback signal from the feedback generator, the third integrator configured to integrate an output of the first combiner and to produce a third multi-bit output, and
   a second truncation stage configured to receive the third multi-bit output, to truncate a least significant bit from the third multi-bit output, and to provide the truncated third multi-bit output to the quantizer.

14. The sigma-delta modulator circuit of claim 13, wherein the second truncation stage is configured to truncate more than two bits from the third multi-bit output.

15. The sigma-delta modulator circuit of claim 13, wherein the third integrator is configured to operated at a frequency not more than two times a frequency at which the first integrator operates.

16. A power amplifier comprising:
   a first sigma-delta modulator stage configured to receive an input signal and to produce a multi-bit output;
   a second sigma-delta modulator stage configured to receive an input signal generated using the first sigma-delta modulator stage;
   a first truncation stage disposed between the first sigma-delta modulator stage and the second sigma-delta modulator stage, configured to receive the multi-bit output and configured to truncate at least one of the least significant bits of the multi-bit output prior to providing the truncated multi-bit output to the second sigma-delta modulator; and
   a feedback generator configured to provide a gain to a feedback loop between an output of a quantizer and the first sigma-delta modulator stage.

17. The power amplifier of claim 16, wherein the gain is configured to compensate for the truncation performed by the truncation stage such that the circuit operates in a stable state.

18. The power amplifier of claim 16, wherein the gain is approximately 1.6.

19. The power amplifier of claim 16, further comprising a third sigma-delta modulator stage and a second truncation stage, the second truncation stage being disposed between the second sigma-delta modulator stage and the third sigma-delta modulator stage and being configured to truncate at least one of the lest significant bits of an output of the second sigma-delta modulator stage.

20. The power amplifier of claim 19, wherein the second truncation stage is configured to truncate a greater number of bits than the first truncation stage.

21. The power amplifier of claim 16, wherein the first sigma-delta modulator is configured receive a parallel digital signal comprising more than one bit.

22. The power amplifier of claim 16, wherein the quantizer is configured to quantify a signal generated using the first sigma-delta modulator and the second sigma-delta modulator.

23. The power amplifier of claim 16, wherein the circuit is configured to operate as a power amplifier.

24. The power amplifier of claim 23, further comprising an analog filter configured to couple the power amplifier to an antenna.

25. A method comprising:
   receiving a signal;
   combining the received signal with a first feedback signal to produce a first combined signal;
   integrating the first combined signal to produce a first multi-bit output;
   truncating the first multi-bit output;
   combining the truncated first multi-bit output with a second feedback signal to produce a second combined signal;
   integrating the second combined signal to produce a second multi-bit output;
   quantizing the second multi-bit output or an output generated using the second multi-bit output to produce a quantized signal; and
   using the quantized signal to produce the first feedback signal and the second feedback signal.

26. The method of claim 25, further comprising:
   truncating the second multi-bit output,
   combining the truncated second multi-bit output with a third feedback signal to produce a third combined signal, and
   integrating the third combined signal.

* * * * *

UNITED STATES PATENT AND TRADEMARK OFFICE
CERTIFICATE OF CORRECTION

| | |
|---|---|
| PATENT NO. | : 7,808,415 B1 |
| APPLICATION NO. | : 12/410964 |
| DATED | : October 5, 2010 |
| INVENTOR(S) | : Michel Robbe et al. |

It is certified that error appears in the above-identified patent and that said Letters Patent is hereby corrected as shown below:

In the Specification:

Column 6
line 14, please replace "210B" with --210C--

In the Claims:

Column 7, Claim #5 should read as follows:

--5. The sigma-delta modulator circuit of claim 1, wherein the first truncation stage includes a feedback loop configured to generate a feedback using the least significant bit.--

Column 7, Claim #9 should read as follows:

--9. The sigma-delta modulator circuit of claim 8, wherein the feedback generator is configured to generate the first and second feedback signals using an output of the quantizer.--

Claim #13, column 7, line 43, please replace "an output of the first combiner" with --an output of the third combiner...--

Signed and Sealed this
Twenty-fifth Day of January, 2011

David J. Kappos
*Director of the United States Patent and Trademark Office*

UNITED STATES PATENT AND TRADEMARK OFFICE
CERTIFICATE OF CORRECTION

PATENT NO. : 7,808,415 B1
APPLICATION NO. : 12/410964
DATED : October 5, 2010
INVENTOR(S) : Michel Robbe et al.

It is certified that error appears in the above-identified patent and that said Letters Patent is hereby corrected as shown below:

In the Specification:

Column 6
line 14, please replace "210B" with --210C--

In the Claims:

Column 7
lines 9-11, Claim #5 should read as follows:

--5. The sigma-delta modulator circuit of claim 1, wherein the first truncation stage includes a feedback loop configured to generate a feedback using the least significant bit.--

Column 7
lines 21-23, Claim #9 should read as follows:

--9. The sigma-delta modulator circuit of claim 8, wherein the feedback generator is configured to generate the first and second feedback signals using an output of the quantizer.--

Column 7
line 43, Claim #13, please replace "an output of the first combiner" with --an output of the third combiner...--

This certificate supersedes the Certificate of Correction issued January 25, 2011.

Signed and Sealed this
Fifteenth Day of February, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,808,415 B1 | Page 1 of 1 |
| APPLICATION NO. | : 12/410964 | |
| DATED | : October 5, 2010 | |
| INVENTOR(S) | : Michel Robbe et al. | |

It is certified that error appears in the above-identified patent and that said Letters Patent is hereby corrected as shown below:

Column 7, Claim 13, Line 38 -
Please replace "the" quantizer with --a-- quantizer Column 8, Claim 21, Line 27 -
Please insert --stage-- after "modulator"

Column 8, Claim 22, Line 31 -
Please insert --stage-- after "modulator"

Line 32 -
Please insert --stage-- after "modulator"

Signed and Sealed this
Eighth Day of November, 2011

David J. Kappos
*Director of the United States Patent and Trademark Office*